(12) United States Patent
Chua et al.

(10) Patent No.: US 10,128,102 B2
(45) Date of Patent: Nov. 13, 2018

(54) METHODS AND APPARATUS FOR WETTING PRETREATMENT FOR THROUGH RESIST METAL PLATING

(71) Applicant: Novellus Systems, Inc., Fremont, CA (US)

(72) Inventors: Lee Peng Chua, Beaverton, OR (US); Bryan L. Buckalew, Tualatin, OR (US); Thomas Anand Ponnuswamy, Tualatin, OR (US); Brian Paul Blackman, Newberg, OR (US); Chad Michael Hosack, Tigard, OR (US); Steven T. Mayer, Aurora, OR (US)

(73) Assignee: Novellus Systems, Inc., Fremont, CA (US)

( * ) Notice: Subject to any disclaimer, the term of this patent is extended or adjusted under 35 U.S.C. 154(b) by 55 days.

(21) Appl. No.: 15/424,198

(22) Filed: Feb. 3, 2017

(65) Prior Publication Data

US 2017/0148627 A1    May 25, 2017

Related U.S. Application Data

(62) Division of application No. 14/182,767, filed on Feb. 18, 2014, now Pat. No. 9,613,833.

(Continued)

(51) Int. Cl.
*B08B 3/02* (2006.01)
*H01L 21/02* (2006.01)
(Continued)

(52) U.S. Cl.
CPC ........ *H01L 21/02052* (2013.01); *B08B 3/024* (2013.01); *H01L 21/67051* (2013.01); *H01L 21/68764* (2013.01)

(58) Field of Classification Search
CPC .............. B08B 3/024; H01L 21/02052; H01L 21/67051; H01L 21/68764
(Continued)

(56) References Cited

U.S. PATENT DOCUMENTS

| 1,255,395 A | 2/1918 | Duram |
| 3,360,248 A | 12/1967 | Lindeman et al. |

(Continued)

FOREIGN PATENT DOCUMENTS

| CN | 101504911 A | 8/2009 |
| CN | 102286760 A | 12/2011 |

(Continued)

OTHER PUBLICATIONS

U.S. Appl. No. 09/872,340, filed May 31, 2001, entitled "Methods and Apparatus for Bubble Removal in Wafer Wet Processing".

(Continued)

*Primary Examiner* — Levon J Shahinian
(74) *Attorney, Agent, or Firm* — Weaver Austin Villeneuve & Sampson LLP

(57) ABSTRACT

Disclosed are pre-wetting apparatus designs and methods for cleaning solid contaminants from substrates prior to through resist deposition of metal. In some embodiments, a pre-wetting apparatus includes a process chamber having a substrate holder, and at least one nozzle located directly above the wafer substrate and configured to deliver pre-wetting liquid (e.g., degassed deionized water) onto the substrate at a grazing angle of between about 5 and 45 degrees. In some embodiments the nozzle is a fan nozzle configured to deliver the liquid to the center of the substrate, such that the liquid first impacts the substrate in the vicinity of the center and then flows over the center of the substrate. In some embodiments the substrate is rotated unidirectionally or bidirectionally during pre-wetting with multiple (Continued)

accelerations and decelerations, which facilitate removal of contaminants.

20 Claims, 15 Drawing Sheets

Related U.S. Application Data

(60) Provisional application No. 61/767,062, filed on Feb. 20, 2013.

(51) Int. Cl.
  *H01L 21/67* (2006.01)
  *H01L 21/687* (2006.01)
(58) Field of Classification Search
  USPC .................................. 134/144, 198, 902
  See application file for complete search history.

(56) References Cited

U.S. PATENT DOCUMENTS

| | | |
|---|---|---|
| 3,849,002 A | 11/1974 | Hach |
| 4,101,919 A | 7/1978 | Ammann |
| 4,229,191 A | 10/1980 | Moore |
| 4,297,217 A | 10/1981 | Hines et al. |
| 4,816,081 A | 3/1989 | Mehta et al. |
| 5,000,827 A | 3/1991 | Schuster et al. |
| 5,221,449 A | 6/1993 | Colgan et al. |
| 5,281,485 A | 1/1994 | Colgan et al. |
| 5,427,674 A | 6/1995 | Langenskiold et al. |
| 5,482,611 A | 1/1996 | Helmer et al. |
| 5,555,234 A | 9/1996 | Sugimoto |
| 5,800,626 A | 9/1998 | Cohen et al. |
| 5,831,727 A | 11/1998 | Stream |
| 5,982,762 A | 11/1999 | Anzai et al. |
| 5,985,762 A | 11/1999 | Geffken et al. |
| 6,004,470 A | 12/1999 | Abril |
| 6,017,437 A | 1/2000 | Ting et al. |
| 6,074,544 A | 6/2000 | Reid et al. |
| 6,099,702 A | 8/2000 | Reid et al. |
| 6,110,346 A | 8/2000 | Reid et al. |
| 6,124,203 A | 9/2000 | Joo et al. |
| 6,126,798 A | 10/2000 | Reid et al. |
| 6,139,712 A | 10/2000 | Patton et al. |
| 6,156,167 A | 12/2000 | Patton et al. |
| 6,159,354 A | 12/2000 | Contolini et al. |
| 6,162,344 A | 12/2000 | Reid et al. |
| 6,179,973 B1 | 1/2001 | Lai et al. |
| 6,179,983 B1 | 1/2001 | Reid et al. |
| 6,193,854 B1 | 2/2001 | Lai et al. |
| 6,193,859 B1 | 2/2001 | Contolini et al. |
| 6,217,716 B1 | 4/2001 | Fai Lai |
| 6,221,757 B1 | 4/2001 | Schmidbauer et al. |
| 6,251,242 B1 | 6/2001 | Fu et al. |
| 6,261,433 B1 | 7/2001 | Landau |
| 6,274,008 B1 | 8/2001 | Gopalraja et al. |
| 6,277,249 B1 | 8/2001 | Gopalraja et al. |
| 6,333,275 B1 | 12/2001 | Feng et al. |
| 6,413,388 B1 | 7/2002 | Uzoh et al. |
| 6,503,376 B2 | 1/2003 | Toyoda et al. |
| 6,540,899 B2 | 4/2003 | Keigler |
| 6,544,585 B1 | 4/2003 | Kuriyama et al. |
| 6,551,487 B1 | 4/2003 | Reid et al. |
| 6,562,204 B1 | 5/2003 | Mayer et al. |
| 6,569,299 B1 | 5/2003 | Reid et al. |
| 6,582,578 B1 | 6/2003 | Dordi et al. |
| 6,596,148 B1 | 7/2003 | Belongia et al. |
| 6,689,257 B2 | 2/2004 | Mishima et al. |
| 6,716,332 B1 | 4/2004 | Yoshioka |
| 6,753,250 B1 | 6/2004 | Hill et al. |
| 6,800,187 B1 | 10/2004 | Reid et al. |
| 6,964,792 B1 | 11/2005 | Mayer et al. |
| 7,014,679 B2 | 3/2006 | Parekh et al. |
| 7,097,410 B1 | 8/2006 | Reid et al. |
| 7,270,734 B1 | 9/2007 | Schetty, III et al. |
| 7,303,992 B2 | 12/2007 | Paneccasio et al. |
| 7,670,950 B2 | 3/2010 | Richardson et al. |
| 7,686,927 B1 | 3/2010 | Reid et al. |
| 7,771,662 B2 | 8/2010 | Pressman et al. |
| 7,776,741 B2 | 8/2010 | Reid et al. |
| 8,404,095 B2 | 3/2013 | Perkins et al. |
| 8,795,480 B2 | 8/2014 | Mayer et al. |
| 8,962,085 B2 | 2/2015 | Mayer et al. |
| 8,992,757 B2 | 3/2015 | Willey et al. |
| 9,028,666 B2 | 5/2015 | Ranjan et al. |
| 9,138,784 B1 | 9/2015 | Hawkins et al. |
| 9,435,049 B2 | 9/2016 | Thorum |
| 9,455,139 B2 | 9/2016 | Buckalew et al. |
| 9,481,942 B2 | 11/2016 | Zhou et al. |
| 9,613,833 B2 | 4/2017 | Chua et al. |
| 9,617,648 B2 | 4/2017 | Thorum et al. |
| 9,677,188 B2 | 6/2017 | Stowell et al. |
| 9,721,800 B2 | 8/2017 | Mayer et al. |
| 9,828,688 B2 | 11/2017 | Buckalew et al. |
| 9,852,913 B2 | 12/2017 | Mayer et al. |
| 2001/0015321 A1 | 8/2001 | Reid et al. |
| 2001/0035346 A1 | 11/2001 | Maeda |
| 2002/0027080 A1 | 3/2002 | Yoshioka et al. |
| 2002/0029973 A1 | 3/2002 | Maydan |
| 2002/0084183 A1 | 7/2002 | Hanson et al. |
| 2002/0084189 A1 | 7/2002 | Wang et al. |
| 2002/0195352 A1 | 12/2002 | Mayer et al. |
| 2003/0070941 A1 | 4/2003 | Hirao |
| 2003/0116439 A1 | 6/2003 | Seo et al. |
| 2004/0065561 A1 | 4/2004 | Chalyt et al. |
| 2004/0084315 A1 | 5/2004 | Mizohata et al. |
| 2004/0188257 A1 | 9/2004 | Klocke et al. |
| 2004/0198190 A1 | 10/2004 | Basol et al. |
| 2004/0200725 A1 | 10/2004 | Yahalom et al. |
| 2004/0231794 A1 | 11/2004 | Hongo et al. |
| 2004/0262165 A1 | 12/2004 | Kanda et al. |
| 2005/0008786 A1 | 1/2005 | Dubin et al. |
| 2005/0026455 A1 | 2/2005 | Hamada et al. |
| 2005/0145482 A1 | 7/2005 | Suzuki et al. |
| 2005/0255414 A1 | 11/2005 | Inabe et al. |
| 2006/0065536 A1 | 3/2006 | Jentz et al. |
| 2006/0102485 A1 | 5/2006 | Nakano et al. |
| 2006/0141157 A1 | 6/2006 | Sekimoto et al. |
| 2006/0207886 A1 | 9/2006 | Isono et al. |
| 2006/0266393 A1 | 11/2006 | Verhaverbeke et al. |
| 2006/0283710 A1 | 12/2006 | Cohen et al. |
| 2007/0235343 A1 | 10/2007 | Watikowski et al. |
| 2008/0041423 A1 | 2/2008 | Hardikar et al. |
| 2008/0149487 A1 | 6/2008 | Lee |
| 2008/0200018 A1 | 8/2008 | Kawamoto |
| 2009/0151754 A1 | 6/2009 | Zhu et al. |
| 2009/0183992 A1 | 7/2009 | Fredenberg et al. |
| 2010/0032310 A1 | 2/2010 | Reid et al. |
| 2010/0044236 A1 | 2/2010 | Mayer et al. |
| 2010/0084275 A1 | 4/2010 | Hanafusa |
| 2010/0116672 A1 | 5/2010 | Mayer et al. |
| 2010/0163078 A1 | 7/2010 | Hsu et al. |
| 2010/0200412 A1 | 8/2010 | Reid et al. |
| 2010/0200960 A1 | 8/2010 | Angyal et al. |
| 2010/0247761 A1 | 9/2010 | Hashimoto |
| 2010/0320081 A1* | 12/2010 | Mayer ................. H01L 21/2885 204/242 |
| 2010/0320609 A1 | 12/2010 | Mayer et al. |
| 2011/0043239 A1 | 2/2011 | Tomita et al. |
| 2011/0284386 A1 | 11/2011 | Willey et al. |
| 2012/0175263 A1 | 7/2012 | Ganesan et al. |
| 2012/0255864 A1 | 10/2012 | Nagai et al. |
| 2012/0292192 A1 | 11/2012 | Ranjan et al. |
| 2013/0143071 A1 | 6/2013 | Kleinle |
| 2013/0171833 A1 | 7/2013 | Buckalew et al. |
| 2013/0264213 A1 | 10/2013 | Roeger-Goepfert et al. |
| 2014/0097088 A1 | 4/2014 | Stowell et al. |
| 2014/0230860 A1 | 8/2014 | Chua et al. |
| 2015/0096883 A1 | 4/2015 | Mayer et al. |
| 2015/0126030 A1 | 5/2015 | Yang et al. |
| 2015/0140814 A1 | 5/2015 | Thorum |
| 2015/0159289 A1 | 6/2015 | Willey et al. |
| 2015/0179458 A1 | 6/2015 | Mayer et al. |

(56) References Cited

U.S. PATENT DOCUMENTS

| | | | |
|---|---|---|---|
| 2016/0222535 A1 | 8/2016 | Zhou et al. | |
| 2016/0258078 A1 | 9/2016 | Thorum et al. | |
| 2016/0281255 A1 | 9/2016 | Buckalew et al. | |
| 2018/0023209 A1 | 1/2018 | Buckalew et al. | |
| 2018/0138044 A1 | 5/2018 | Mayer et al. | |

FOREIGN PATENT DOCUMENTS

| | | | |
|---|---|---|---|
| CN | 102677139 A | 9/2012 | |
| CN | 102786879 A | 11/2012 | |
| CN | 102804343 A | 11/2012 | |
| CN | 103305886 A | 9/2013 | |
| EP | 0 860 866 | 8/1998 | |
| JP | H02-236295 A | 9/1990 | |
| JP | 06151397 A | 5/1994 | |
| JP | H07-72357 B2 | 8/1995 | |
| JP | 2000-345398 A | 12/2000 | |
| JP | 2001-316889 A | 11/2001 | |
| JP | 2003-129283 A | 5/2003 | |
| JP | 2003-535223 A | 11/2003 | |
| JP | 2006-004955 | 1/2006 | |
| JP | 2006-525429 A | 11/2006 | |
| JP | 2007-138304 | 6/2007 | |
| JP | 2009-064599 A | 3/2009 | |
| KR | 10-1999-0029433 | 4/1999 | |
| KR | 10-2001-0052062 | 6/2001 | |
| KR | 10-2004-0020882 | 3/2004 | |
| KR | 10-2007-0071097 A | 7/2007 | |
| TW | 483040 B | 4/2002 | |
| TW | 200716793 | 5/2007 | |
| TW | I281516 | 5/2007 | |
| TW | 201109481 A1 | 3/2011 | |
| WO | WO 1999/010566 | 3/1999 | |
| WO | WO 1999/041434 | 8/1999 | |
| WO | WO 01/68952 | 9/2001 | |
| WO | WO 2002/062446 | 8/2002 | |
| WO | WO 2007/112768 | 10/2007 | |
| WO | WO 2010/148147 | 12/2010 | |
| WO | WO 2012/022660 | 2/2012 | |

OTHER PUBLICATIONS

U.S. Office Action, dated Sep. 19, 2016, issued in U.S. Appl. No. 14/102,239.
U.S. Office Action, dated Nov. 12, 2015, issued in U.S. Appl. No. 14/182,767.
U.S. Office Action, dated May 20, 2016, issued in U.S. Appl. No. 14/182,767.
U.S. Notice of Allowance, dated Nov. 25, 2016, issued in U.S. Appl. No. 14/182,767.
U.S. Office Action, dated Jun. 5, 2015, issued in U.S. Appl. No. 14/085,262.
U.S. Final Office Action, dated Oct. 23, 2015, issued in U.S. Appl. No. 14/085,262.
U.S. Notice of Allowance, dated May 3, 2016, issued in U.S. Appl. No. 14/085,262.
U.S. Notice of Allowance, dated Jun. 23, 2016, issued in U.S. Appl. No. 14/613,306.
U.S. Notice of Allowability, dated Oct. 12, 2016, issued in U.S. Appl. No. 14/613,306.
U.S. Office Action, dated Feb. 5, 2016, issued in U.S. Appl. No. 14/638,750.
U.S. Office Action, dated Aug. 10, 2016, issued in U.S. Appl. No. 14/638,750.
U.S. Notice of Allowance, dated Dec. 21, 2016 issued in U.S. Appl. No. 14/638,750.
U.S. Office Action, dated Aug. 31, 2005, issued in U.S. Appl. No. 09/872,340.
U.S. Office Action, dated Apr. 14, 2005, issued in U.S. Appl. No. 09/872,340.
U.S. Office Action, dated Jan. 18, 2006, issued in U.S. Appl. No. 09/872,340.
U.S. Office Action, dated May 26, 2006, issued in U.S. Appl. No. 09/872,340.
U.S. Office Action, dated Nov. 8, 2006, issued in U.S. Appl. No. 09/872,340.
U.S. Final Office Action, dated Mar. 14, 2007, issued in U.S. Appl. No. 09/872,340.
U.S. Office Action, dated Jun. 27, 2012 in U.S. Appl. No. 12/684,787.
U.S. Office Action, dated Apr. 8, 2013 in U.S. Appl. No. 12/684,787.
U.S. Final Office Action, dated Jul. 24, 2013 in U.S. Appl. No. 12/684,787.
U.S. Office Action, dated Oct. 29, 2013 in U.S. Appl. No. 12/684,787.
U.S. Final Office Action, dated Mar. 3, 2014 in U.S. Appl. No. 12/684,787.
U.S. Office Action, dated Aug. 26, 2014 in U.S. Appl. No. 12/684,787.
U.S. Notice of Allowance, dated Oct. 10, 2014 in U.S. Appl. No. 12/684,787.
U.S. Notice of Allowance (Supplemental Notice of Allowability), dated Oct. 22, 2014 in U.S. Appl. No. 12/684,787.
U.S. Notice of Allowance (Supplemental Notice of Allowability), dated Oct. 28, 2014 in U.S. Appl. No. 12/684,787.
U.S. Office Action, dated Apr. 12, 2011, issued in U.S. Appl. No. 12/684,792.
U.S. Final Office Action, dated Jul. 26, 2011, issued in U.S. Appl. No. 12/684,792.
U.S. Office Action, dated Sep. 27, 2013, issued in U.S. Appl. No. 12/684,792.
U.S. Final Office Action, dated Apr. 10, 2014, issued in U.S. Appl. No. 12/684,792.
U.S. Office Action, dated Oct. 23, 2015, issued in U.S. Appl. No. 14/326,899.
U.S. Notice of Allowance, dated May 6, 2016, issued in U.S. Appl. No. 14/326,899.
U.S. Notice of Allowance, dated Aug. 26, 2016, issued in U.S. Appl. No. 14/326,899.
U.S. Office Action, dated Jul. 29, 2015, issued in U.S. Appl. No. 13/775,987.
U.S. Notice of Allowance, dated Mar. 14, 2016, issued in U.S. Appl. No. 13/775,987.
U.S. Notice of Allowance (Corrected Notice of Allowability), dated Apr. 26, 2016, issued in U.S. Appl. No. 13/775,987.
U.S. Notice of Allowance (Corrected Notice of Allowability), dated Jun. 17, 2016, issued in U.S. Appl. No. 13/775,987.
U.S. Office Action, dated Jun. 6, 2013, issued in U.S. Appl. No. 12/961,274.
U.S. Final Office Action, dated Oct. 28, 2013, issued in U.S. Appl. No. 12/961,274.
U.S. Notice of Allowance, dated Jan. 21, 2014, issued in U.S. Appl. No. 12/961,274.
U.S. Office Action, dated Jul. 25, 2014, issued in U.S. Appl. No. 12/961,274.
U.S. Final Office Action, dated Nov. 28, 2014, issued in U.S. Appl. No. 12/961,274.
U.S. Notice of Allowance, dated May 27, 2015, issued in U.S. Appl. No. 12/961,274.
Chinese First Office Action dated Nov. 2, 2015 issued in Application No. CN 201310676660.7.
Chinese Second Office Action dated Jun. 20, 2016 issued in Application No. CN 201310676660.7.
Chinese Third Office Action dated Jan. 5, 2017 issued in Application No. CN 201310676660.7.
Chinese First Office Action dated Aug. 3, 2016 issued in Application No. CN 201410658497.6.
PCT International Search Report and Witten Opinion, dated Jan. 5, 2011, issued in PCT/US2010/038901.
PCT International Preliminary Report on Patentability and Written Opinion dated Jan. 5, 2012, issued in PCT/US2010/038901.
Chinese First Office Action dated Aug. 14, 2014 issued in Application No. CN 201080026847.7.
Korean Office Action, dated Jan. 5, 2012 in Application No. KR 2010-7026340.

(56) References Cited

OTHER PUBLICATIONS

Taiwan Office Action dated Nov. 18, 2014 issued in Application No. TW 099119625.
Taiwan Office Action dated Mar. 22, 2016 issued in Application No. TW 104118528.
Taiwan Examination and Search Report dated Oct. 13, 2016 issued in Application No. TW 102108847.
Chinese First Office Action dated Jul. 7, 2016 issued in Application No. CN 201310080545.3.
Bozzini et al., (2006) "An electrochemical and in situ SERS study of Cu electrodeposition from acidic sulphate solutions in the presence of 3-diethylamino-7-(4-dimethylaminophenylazo)-5-phenylphenazinium chloride (Janus Green B)", *Journal of Applied Electrochemistry*, 36(9): 973-981.
Kim, S-K. et al., (2006) "Cationic Surfactants for the Control of Overfill Bumps in Cu Superfilling" *Journal of Electrochemical Society*, 153(12):C826-C833.
Kondo et al., (2010) "High Speed Through Silicon via Filling by Copper Electrodeposition," *Electrochemical and Solid State Letters*, 13(5):D26-D28.
Li, Guang et al., (2002) "Quantitative analysis of HBsAg in vaccinum hepatitis B by high performance capillary zone electrophoresis," *Analytical Instrumentation*, Issue 1, pp. 21-23 [Abstract Only].
Luhn et al., (2009) "Filling of microvia with an aspect ratio of 5 by copper electrodeposition," *Electrochimica Acta*, 54:2504-2508.
Taiwanese First Office Action dated Jun. 8, 2018 issued in Application No. TW 103140081.
U.S. Notice of Allowance dated Feb. 17, 2017, issued in U.S. Appl. No. 14/102,239.
U.S. Office Action, dated May 22, 2017 issued in U.S. Appl. No. 14/593,676.
U.S. Notice of Allowance, dated Aug. 31, 2017 issued in U.S. Appl. No. 14/593,676.
U.S. Notice of Allowance [Corrected Notice of Allowability], dated Jun. 28, 2017, issued in U.S. Appl. No. 14/326,899.
U.S. Notice of Allowance, dated Jul. 5, 2017, issued in U.S. Appl. No. 15/181,150.
U.S. Notice of Allowance (Corrected Notice of Allowability), dated Sep. 5, 2017, issued in U.S. Appl. No. 15/181,150.
U.S. Notice of Allowance (Supplemental Notice of Allowability), dated Oct. 27, 2017, issued in U.S. Appl. No. 15/181,150.
Chinese Decision of Final Rejection dated Apr. 7, 2017 issued in Application No. CN 201310676660.7.
Taiwan Examination Report dated Mar. 17, 2017 issued in Application No. TW 102145646.
Japanese First Office Action dated Nov. 28, 2017 issued in Application No. JP 2013-256183.
Taiwan First Office Action dated Dec. 11, 2017 issued in Application No. TW 103105553.
Chinese Second Office Action dated Feb. 22, 2017 issued in Application No. CN 201410658497.6.
Chinese First Office Action dated Jul. 18, 2017 issued in Application No. CN 201610124296.7.
Chinese First Office Action dated Apr. 5, 2017 issued in Application No. CN 201510239529.3.
Chinese Second Office Action dated Mar. 5, 2018 issued in Application No. CN 201510239529.3.

* cited by examiner

METHODS AND APPARATUS FOR WETTING PRETREATMENT FOR THROUGH RESIST METAL PLATING

CROSS-REFERENCE TO RELATED APPLICATIONS

This application is a divisional of and claims benefit of the filing date of the U.S. application Ser. No. 14/182,767, filed Feb. 18, 2014, (issued as U.S. Pat. No. 9,613,833 on Apr. 4, 2017), naming Chua et al. as inventors, which claims benefit of the filing date of U.S. Provisional Application No. 61/767,062, filed Feb. 20, 2013, which are incorporated herein by reference in their entirety.

FIELD OF THE INVENTION

The embodiments disclosed herein relate to pre-wetting and cleaning apparatus designs and methods. More specifically, embodiments relate to pre-wetting apparatus designs and methods for pre-wetting a semiconductor wafer prior to depositing electrically conductive materials on the wafer for integrated circuit manufacturing.

BACKGROUND

Wetting is a property of a liquid/solid interface governed by adhesive forces between the liquid and solid and cohesive forces in the liquid. Adhesive forces between the liquid and solid cause the liquid to spread across the solid surface. Cohesive forces in the liquid cause the liquid to minimize contact with the solid surface. The wetting of a solid surface by a liquid is important in many industrial processes where a liquid interacts with a solid surface. Electroplating (a cathodic process), including electroplating in integrated circuit manufacturing, is one such industrial process. Wetting is also important in anodic processes, including electroetching and electropolishing.

For example, many semiconductor and microelectronic processing operations make use of through resist electrodeposition. This plating process is also sometimes referred to as through-mask or photoresist patterned electrodeposition. These processes may be associated with plating submicrometer gold interconnects on GaAs wafers, plating copper coils or magnetic alloys for thin-film recording heads, plating copper conductors for redistribution or integrated passive applications, or plating PbSn or lead-free solders for flip chip connection. All of these processes involve substrates having a blanket conductive seed layer, or a conductive plating base, and a patterned dielectric template, into which metal is deposited.

SUMMARY

Methods and apparatus for treating the semiconductor substrates prior to through-resist electroplating (or other processing) are provided. The substrates typically contain a conductive layer and a layer of patterned photoresist disposed on top of the conductive layer, wherein the conductive layer is exposed at the bottoms of recessed features formed in photoresist. Typically the substrate contains a plurality of recessed features formed in photoresist.

A clean and wetted surface of such substrate is needed for many processing operations, and particularly for electroplating, since inadequate wetting or incomplete removal of contaminants may result in formation of voids in the recessed features during electroplating.

One of the problems associated with pre-wetting and cleaning of substrates in through resist processing is difficulty in removal of solid contaminating material (such as particles and residue) from recessed features located at the central portions of the substrate and/or difficulty of forming a continuous wetting layer in these locations. Further, improved wetting and cleaning methods for other locations on the substrate (not only the center), are also needed.

Apparatus and methods for delivery of pre-wetting fluid onto the substrate, such as to efficiently wet and/or clean the substrate at desired locations are provided. The substrates are pre-wetted and cleaned such as to remove contaminating particulate material, including photoresist particles and residue and to provide a wetted surface suitable for subsequent processing, such as for electroplating on a wetted substrate.

In one aspect an apparatus is provided. The apparatus includes a process chamber having a substrate holder configured for holding the substrate, and at least one nozzle configured to be positioned directly above the substrate and configured to direct pre-wetting liquid (e.g., water) at a grazing angle of between about 5-45 degrees to the plane of the substrate. In some embodiments the nozzle is configured to direct the pre-wetting fluid to the central portion of the substrate, such that the liquid from the nozzle first impacts the substrate near the center, but not directly at the center, and such that the delivered liquid spills over the center of the substrate. In some embodiments, the nozzle is a fan nozzle, but other types of nozzles such as conical nozzles can be used in other embodiments. Preferably, the nozzle is a high velocity nozzle that is configured to deliver pre-wetting liquid at a liquid velocity of at least about 8 meters per second, such as at least 16 meters per second at the point of impact with the substrate. The high velocity is selected such as to remove the solid contaminants from the substrate surface (particularly contaminants adhering to the substrate in the recessed features). The substrate holder in the apparatus is preferably configured to rotate the substrate during delivery of the pre-wetting fluid. Preferably, but not necessarily, the direction of rotation of the substrate is substantially opposite to the direction of the horizontal component of the pre-wetting stream, since this increases the effective velocity of the stream on impact with the substrate. In some embodiments, the apparatus is configured for bi-directionally rotating the substrate during delivery of the pre-wetting fluid. For example, the substrate holder may be configured to rotate the substrate in a clockwise direction for a period of time, followed by a period of rotation in a counterclockwise direction, for a total of between about 4-100 direction changes during pre-wetting process. In some embodiments, the apparatus is configured to change the direction of the impacting pre-wetting liquid from the nozzle such that it is synchronized with bidirectional substrate rotation and such that the horizontal component of the impacting liquid is opposite to the direction of rotation of the substrate both during clockwise and counterclockwise rotation.

In another aspect, which can be implemented separately or in combination with any of the embodiments described above, an apparatus is provided which includes a process chamber having a substrate holder configured for holding the substrate, and at least one nozzle mounted to a moveable arm, wherein the moveable arm is configured to move the nozzle from an inactive position to an active position. In one embodiment the moveable arm is configured to position the nozzle away from the wafer substrate in an inactive position (e.g., not directly above the substrate when the substrate is in a face-up orientation), and to position the nozzle facing the substrate in an active position (e.g., directly above the substrate in the substrate face-up orientation). For example, the moveable arm may be configured to remain in the inactive position prior to pre-wetting, then swing to an active position and remain in the active position while the apparatus delivers the pre-wetting liquid, and then swing to an inactive position after pre-wetting is completed.

In some embodiments the moveable arm is configured to move the nozzle above the surface of the wafer substrate during the course of pre-wetting treatment, thereby allowing to direct the pre-wetting liquid to desired locations on the substrate. For example, the arm carrying the nozzle may move in a sweeping motion in the plane that is parallel to the plane of the substrate.

In some embodiments, the moveable arm is further configured to move in a plane that is perpendicular to the plane of the substrate and to bring the nozzle closer or further away from the substrate. For example, the arm may be configured to lower the nozzle to a desired distance above the wafer.

In another aspect, which may be used separately or in combination with any of the embodiments described above, the cleaning of solid contaminants from the substrate, and particularly from central portion of the substrate is enhanced by modulating the rotation rate of the substrate during delivery of the pre-wetting fluid. In some embodiments, an apparatus is provided, wherein the apparatus includes a process chamber containing a substrate holder for holding and rotating the substrate; an inlet for delivering a pre-wetting liquid onto the substrate and a controller comprising program instructions or logic for: rotating the substrate at a first rotation rate; rapidly decelerating the substrate to a lower rotation rate or to a stationary state; maintaining the substrate at a lower rotation rate or in a stationary state, and then rapidly accelerating the substrate. The controller further includes instructions for delivering the pre-wetting liquid (continuously or in pulses) while the substrate is rotated with speed modulation. The controller further includes instructions for repeating the deceleration and acceleration of the substrate. Preferably, the pre-wetting process includes at least about 4 accelerations, such as at least about 6 accelerations, e.g., between about 4-100 accelerations. Preferably the accelerations and decelerations are very rapid such as at least about 100 rpm per second, or at least 200 rpm per second. In some embodiments, the controller includes instructions for rotating the substrate bi-directionally. The apparatus configured for modulating the rotation speed of the substrate can be used with any kind of nozzle, but is particularly effective, when the nozzle is configured to provide the pre-wetting liquid at a grazing angle of between about 5-45 degrees. The nozzle may direct the liquid to impact the wafer substrate near the center of the substrate such that the delivered liquid overflows the center. High-velocity fan nozzles positioned directly above the substrate are used in some embodiments. In some embodiments, the liquid is directed onto the substrate from a nozzle mounted to the sidewall of the process chamber and directed such that the pre-wetting liquid impacts the substrate at a grazing angle of between about 5-45 degrees near the center of the substrate. In other embodiments the nozzle provides liquid onto the substrate substantially perpendicularly to the plane of the substrate.

In another aspect, which can be used in combination with any of the embodiments described above, a method of pre-treating a semiconductor substrate is provided, wherein the method includes: (a) positioning a substrate into a substrate holder in a pre-wetting process chamber, wherein the substrate includes a plurality of recessed features formed in a photoresist; and (b) directing a pre-wetting liquid onto the substrate at a grazing angle of between about 5-45 degrees, from a nozzle positioned directly above the substrate.

In another aspect, which can be used in combination with any of the embodiments described above, a method of pre-treating a semiconductor substrate is provided, wherein the method includes: (a) positioning a substrate into a substrate holder in a pre-wetting process chamber, wherein the substrate includes a plurality of recessed features formed in a photoresist; (b) rotating a moveable arm with a nozzle from an inactive position to an active position; (c) delivering the pre-wetting liquid onto the substrate while the arm is in the active position; (d) stopping the delivery of the pre-wetting fluid; and (e) moving the arm to an inactive position.

In another aspect, which can be used in combination with any of the embodiments described above, a method of pre-treating a semiconductor substrate is provided, wherein the method includes: (a) positioning a substrate into a substrate holder in a pre-wetting process chamber, wherein the substrate includes a plurality of recessed features formed in a photoresist; (b) rotating the substrate while modulating the rotation rate of the substrate with a plurality of accelerations and decelerations, and while delivering a pre-wetting liquid onto the substrate.

While the methods and apparatus described above can be used in any type of an apparatus having suitable configuration for delivery of pre-wetting fluid, in some embodiments, which can be used in conjunction with any of the embodiments described above, the apparatus includes a degasser, such as a membrane contact degasser, configured for removing one or more dissolved gases from the pre-wetting liquid such that the formed liquid has about 0.5 ppm or less dissolved atmospheric gas. Further the apparatus may include a vacuum port (which is in some embodiments located below the wafer holder) configured to allow formation of a subatmospheric pressure in the process chamber (e.g., of 100 torr or less), and a fluid inlet coupled to the degasser and configured to deliver the degassed pre-wetting fluid onto the wafer substrate. Preferably the apparatus is configured such that the process chamber remains under subatmospheric pressure when pre-wetting liquid is first delivered onto the substrate. After the initial contact with the pre-wetting fluid, the pressure may be increased to atmospheric or higher than atmospheric, while the pre-wetting fluid continues to be delivered onto the substrate. In other embodiments the entire pre-wetting process is conducted at subatmospheric pressure. Preferably, at least the fluid that first contacts the substrate is a degassed liquid. In some embodiments, degassed deionized water is used as a pre-wetting liquid. In some embodiments water containing surfactants is used as a pre-wetting liquid to facilitate removal of solid contaminants.

In some embodiments the process chamber includes a cover and a body, wherein the cover remains stationary and the body is configured to move in a substantially vertical manner to bring the body into contact with the cover and to form a vacuum seal, and wherein a manifold containing a plurality of nozzles configured to deliver pre-wetting liquid is connected to the cover. In some embodiments the rotatable arm described above is attached to the cover of the process chamber.

In some embodiments the wafer holder is configured to hold the wafer substrate in a substantially face-up orientation, and the apparatus is configured to spray the pre-wetting fluid onto the wafer substrate from one or more nozzles, such as nozzles configured to deliver the pre-wetting fluid at a grazing angle of between about 5-45 degrees, as described above.

A typical substrate which can be pre-wetted in such an apparatus includes a metal layer and an overlying photoresist, wherein features in the photoresist expose portions of the metal layer. In some embodiments the features in the photoresist include features having aspect ratios of about 2 to 1 to about 1 to 2, wherein the features in the photoresist have openings having a size of about 5 micrometers to 200 micrometers.

In some embodiments the program instructions of the controller further include instructions for: after forming the wetting layer on the wafer substrate, stopping delivery of the degassed pre-wetting fluid, and after stopping the delivery of the degassed pre-wetting fluid, rotating the wafer substrate at a different rotation rate to remove excess surface entrained degassed pre-wetting fluid from the wafer substrate.

In some embodiments the program instructions of the controller further include instructions for increasing pressure in the process chamber to atmospheric pressure or to above atmospheric pressure after stopping the delivery of the degassed pre-wetting fluid and prior to removal of the excess surface entrained pre-wetting fluid.

Typically the program instructions further include instructions for reducing pressure in the process chamber to the subatmospheric pressure prior to forming the wetting layer on the wafer substrate. For example the program instructions may specify initiating the formation of the wetting layer on the wafer substrate when a pressure in the process chamber is reduced to less than about 50 Torr and contacting the wafer substrate with the degassed pre-wetting fluid for about 10 seconds to 120 seconds.

In another aspect, a system is provided, which includes the apparatus as described in any of the embodiments provided herein and a stepper.

In another aspect a method is provided as any of the pre-wetting methods described herein, wherein the method further includes the steps of applying photoresist to the wafer substrate; exposing the photoresist to light; patterning the resist and transferring the pattern to the wafer substrate; and selectively removing the photoresist from the work piece. Typically the photoresist is applied, developed and patterned prior to pre-wetting described herein. The photoresist is typically removed after the substrate was wetted and the recessed features were filled with metal.

In another aspect a non-transitory computer machine-readable medium including program instructions for control of an apparatus is provided, wherein the program instructions include code for operations of any of the methods described herein.

In one aspect, a pre-wetting apparatus for pre-wetting a wafer substrate is provided, wherein the apparatus includes: (a) a degasser configured to remove one or more dissolved gases from a pre-wetting liquid to produce a degassed pre-wetting liquid; and (b) a process chamber comprising: an inlet coupled to the degasser and configured to admit the degassed pre-wetting liquid; at least one nozzle coupled to the inlet and mounted to a moveable arm, wherein the moveable arm is configured to position the nozzle directly above the substrate when the arm is in an active position, and away from the substrate when the arm is in an inactive position, wherein the nozzle is configured to direct the pre-wetting liquid at a grazing angle of between about 5-45 degrees to the plane of the substrate, when the arm is in the active position; a substrate holder configured to hold the wafer substrate in a face-up orientation, and a vacuum inlet configured to allow formation of a vacuum in the process chamber. The degasser in some embodiments is a membrane contact degasser that is configured to remove not only oxygen, but other non-condensable gases, such as $N_2$ and $CO_2$ from the pre-wetting liquid.

In one aspect, a method of pre-wetting a wafer substrate is provided, wherein the method includes: (a) degassing a pre-wetting liquid; (b) placing the wafer substrate onto a substrate holder in a pre-wetting process chamber in a face-up orientation, and forming subatmospheric pressure in the pre-wetting process chamber; (c) moving a moveable arm having one or more nozzles from an inactive position to an active position in the process chamber; and (d) delivering the degassed pre-wetting liquid from the one or more nozzles onto the wafer substrate at the subatmospheric pressure, wherein the pre-wetting liquid impacts the wafer substrate at a grazing angle of between about 5-45 degrees to the plane of the substrate.

DETAILED DESCRIPTION

Reference will now be made to specific embodiments. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Disclosed herein are apparatus designs and methods for substrate pre-wetting and/or cleaning. While the term "pre-wetting" and "pre-wetting liquid" will be used herein, it is understood that in some embodiments the process combines both wetting and cleaning components, and that in some embodiments the primary purpose of the process is cleaning, e.g., removal of solid contaminants from the recessed features on the substrate. It is understood that the term "pre-wetting" as used herein is directed to comprise cleaning and/or wetting of the substrate.

Delivery of Liquid at a Small Grazing Angle

Figure 1:
FIG. 1 illustrates the grazing angle of the impacting pre-wetting liquid on a semiconductor wafer substrate, according to embodiments provided herein.

It was discovered that delivery of fluid onto the wafer substrate at a relatively small grazing angle (as opposed to delivery of a stream perpendicular to the wafer substrate) is particularly efficient at removing solid contaminants from recessed features on a substrate. The delivery of the pre-wetting fluid at a small grazing angle is illustrated by FIG. 1, which illustrates a plane of the wafer substrate 101 being impacted by a pre-wetting fluid stream or spray 103 at a small grazing angle α. The grazing angle, referred to herein, refers to an angle between the main component of spray/stream and the plane of the wafer substrate. It is understood that the grazing angle refers to the smaller angle between the impacting fluid and the plane of the substrate. Thus, for example if the fluid is directed onto the substrate in a direction that is opposite to the direction shown in FIG. 1, the grazing angle would be 180-α degrees. Preferably, the grazing angle is between about 5-45 degrees, such as between about 5-30 degrees. Thus, in some embodiments, the pre-wetting liquid, such as degassed deionized water is delivered onto the wafer substrate, which typically has a plurality of recessed features, at the grazing angle of between about 5-45 degrees.

Figure 2:
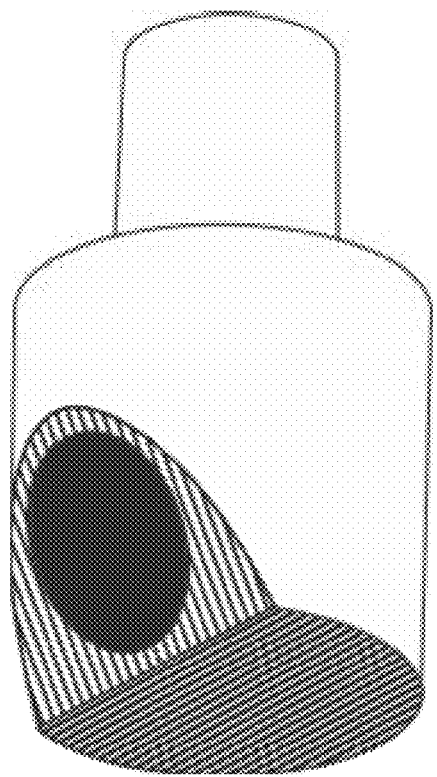
FIG. 2 presents an illustration of a nozzle configured for delivering pre-wetting liquid at a grazing angle of between about 5-45 degrees to the plane of the substrate.

In some embodiments, the fluid is delivered at this angle by one or more nozzles configured for sideways delivery of fluid, such as a nozzle shown in FIG. 2. Such nozzles may be positioned directly above the wafer substrate. The grazing angle is preferably between about 5-45 degrees, such as between about 5-30 degrees. When such nozzles are positioned directly above the wafer substrate, it is easier to control the delivery of the fluid to a particular location of the wafer substrate and to achieve high velocity of the liquid at impact with the substrate, as well as to position the nozzle at a small distance from the wafer. In some embodiments the nozzle is positioned within about 80 mm from the wafer substrate, such as within about 50 mm from the wafer substrate preferably at a distance of between about 5-80 mm.

In some embodiments the nozzle configured to deliver the pre-wetting liquid onto the substrate is configured to direct the liquid in a general direction from the edge towards the center of the wafer substrate, such that the liquid first impacts the substrate at a grazing angle of between about 5-45 degrees near the center of the substrate but not at the very center, and wherein the delivered liquid flows over the center of the substrate. Such configuration, particularly when combined with the use of high velocity fan nozzles, and modulation of wafer rotation rate during delivery of the liquid is highly effective in cleaning the central portion of the wafer substrate, which is the most challenging portion of the substrate to clean, due to the fact that the substrate center remains stationary, or with relative low linear velocity, during substrate rotation.

In some embodiments, the nozzle, such as the nozzle shown in FIG. 2 is configured to deliver high velocity stream of liquid. For example, in some embodiments the nozzle is configured to deliver pre-wetting liquid at a liquid velocity of at least about 8 meters per second, such as at least 16 meters per second at the point of impact with the substrate. The high velocity is selected such as to remove the solid contaminants from the substrate surface (particularly contaminants adhering to the substrate in the recessed features).

In some embodiments, the apparatus includes a plurality of nozzles, e.g., 2-10 nozzles mounted to an arm position above the wafer substrate, wherein the nozzles are configured to reside above different radial locations of the wafer substrate.

In preferred embodiments, fan nozzles are used to deliver the pre-wetting liquid. Fan nozzles deliver the liquid generally in the shape of a fan, wherein the impact zone between the substrate and the delivered liquid is a line.

Figure 4:
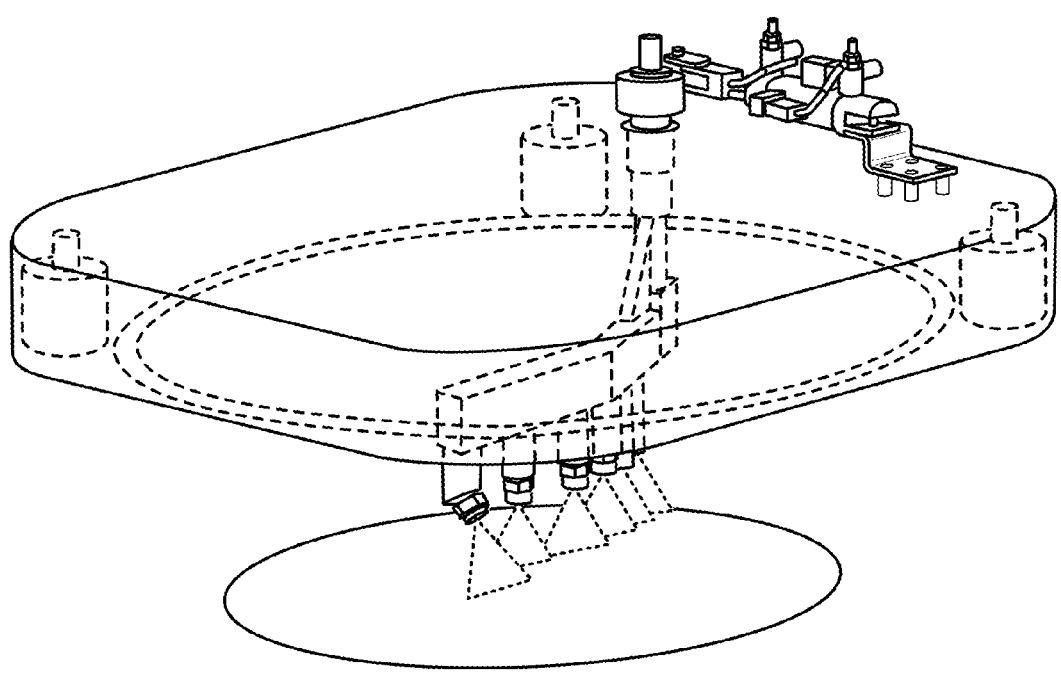
FIG. 4 presents a schematic side view of a process chamber illustrating a plurality of nozzles mounted to an arm, where at least some of the nozzles deliver the pre-wetting liquid at a grazing angle of between about 5-45 degrees to the plane of the substrate, according to embodiments presented herein.
Figure 5:
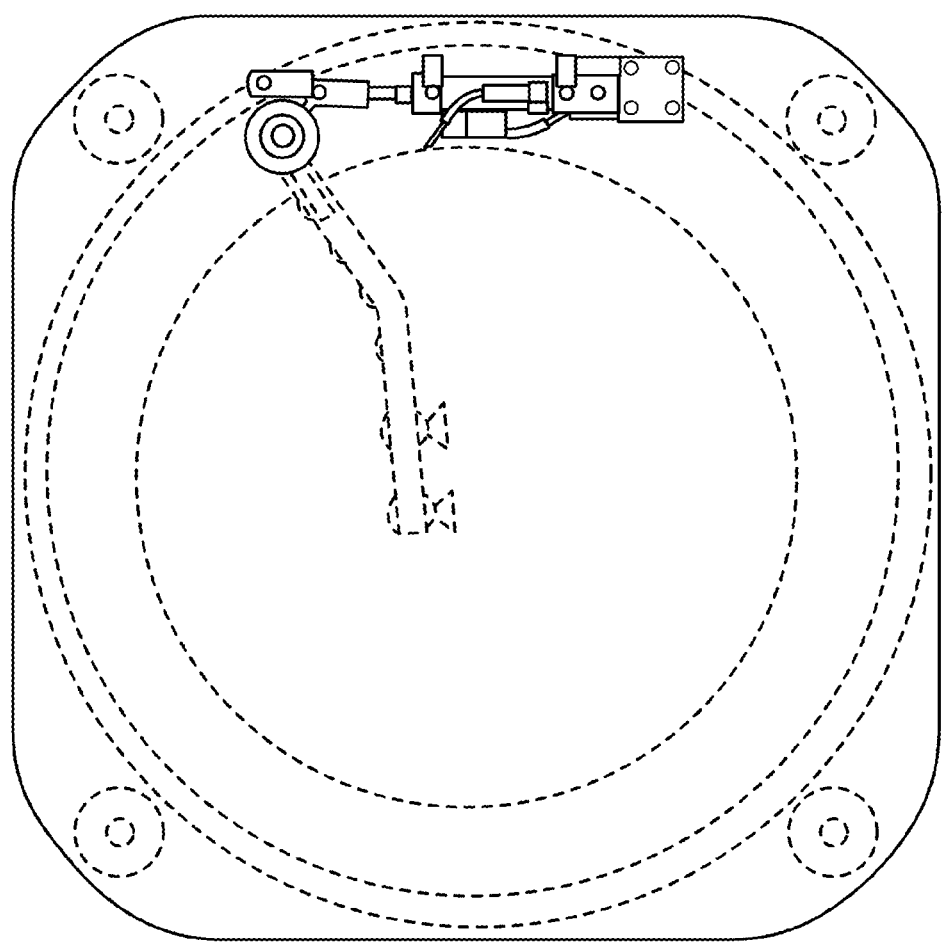
FIG. 5 presents a schematic top view of a process chamber illustrating a plurality of nozzles mounted to an arm, where two of the nozzles deliver the pre-wetting liquid at a grazing angle of between about 5-45 degrees to the plane of the substrate, and are facing in one direction, according to embodiments presented herein.
Figure 6:
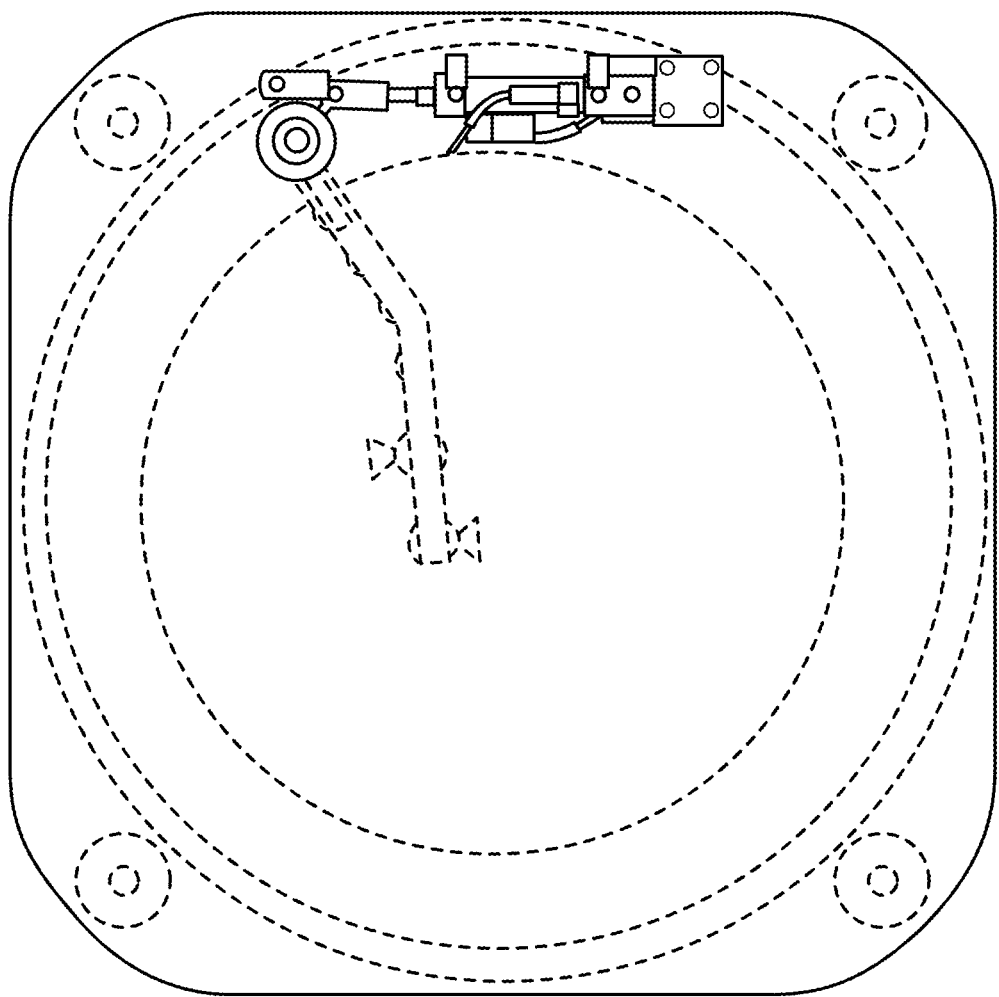
FIG. 6 presents a schematic top view of a process chamber illustrating a plurality of nozzles mounted to an arm, where two of the nozzles deliver the pre-wetting liquid at a grazing angle of between about 5-45 degrees to the plane of the substrate, and are facing in opposite directions, according to embodiments presented herein.
Figure 7:
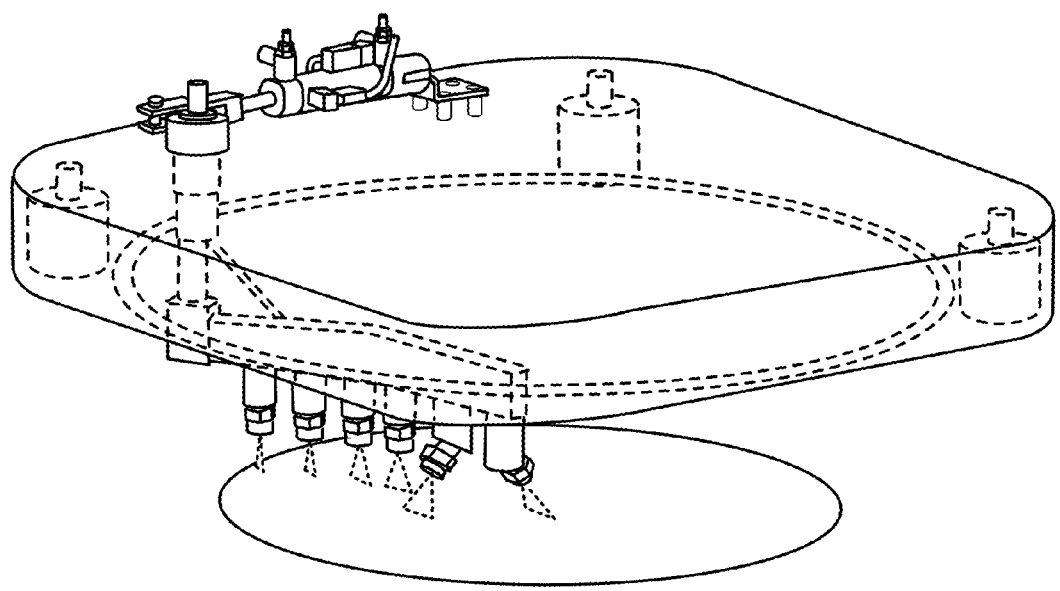
FIG. 7 presents a schematic side view of a process chamber illustrating a plurality of nozzles mounted to an arm, where two of the nozzles deliver the pre-wetting liquid at a grazing angle of between about 5-45 degrees to the plane of the substrate, and are facing in opposite directions, according to embodiments presented herein.

FIGS. 3-9 illustrate various embodiments of a portion of a prewetting apparatus illustrating at least one fan nozzle directing pre-wetting liquid towards the center of the wafer substrate at a small grazing angle. The figures illustrate a cover of a process chamber, a mechanism configured to rotate an arm with a plurality of nozzles which is mounted to the cover, and an arm containing a plurality of nozzles configured to deliver liquid onto the wafer substrate. At least one of the nozzles is positioned such as to deliver the liquid in the direction of the center of the substrate at a small grazing angle. In the depicted embodiments the arm holds six nozzles and is bent such that the first three nozzles and the last three nozzles do not reside in line. Specifically, the nozzles are not located directly above the center of the substrate but are slightly offset to facilitate the delivery of liquid at a small grazing angle in the proximity of the center. It is noted that some of the nozzles may be configured to deliver the pre-wetting liquid substantially perpendicularly to the substrate, while the nozzle closest to the center is configured to deliver the fluid at a small grazing angle. In some embodiments at least two of the nozzles are configured to deliver the liquid at small grazing angles but in different directions, e.g., as shown in FIG. 6.

In some embodiments it is preferable that the liquid is directed, such that the horizontal component of liquid velocity is substantially opposite to the direction of rotation of the wafer substrate, to increase the velocity of liquid on impact.

Figure 3:
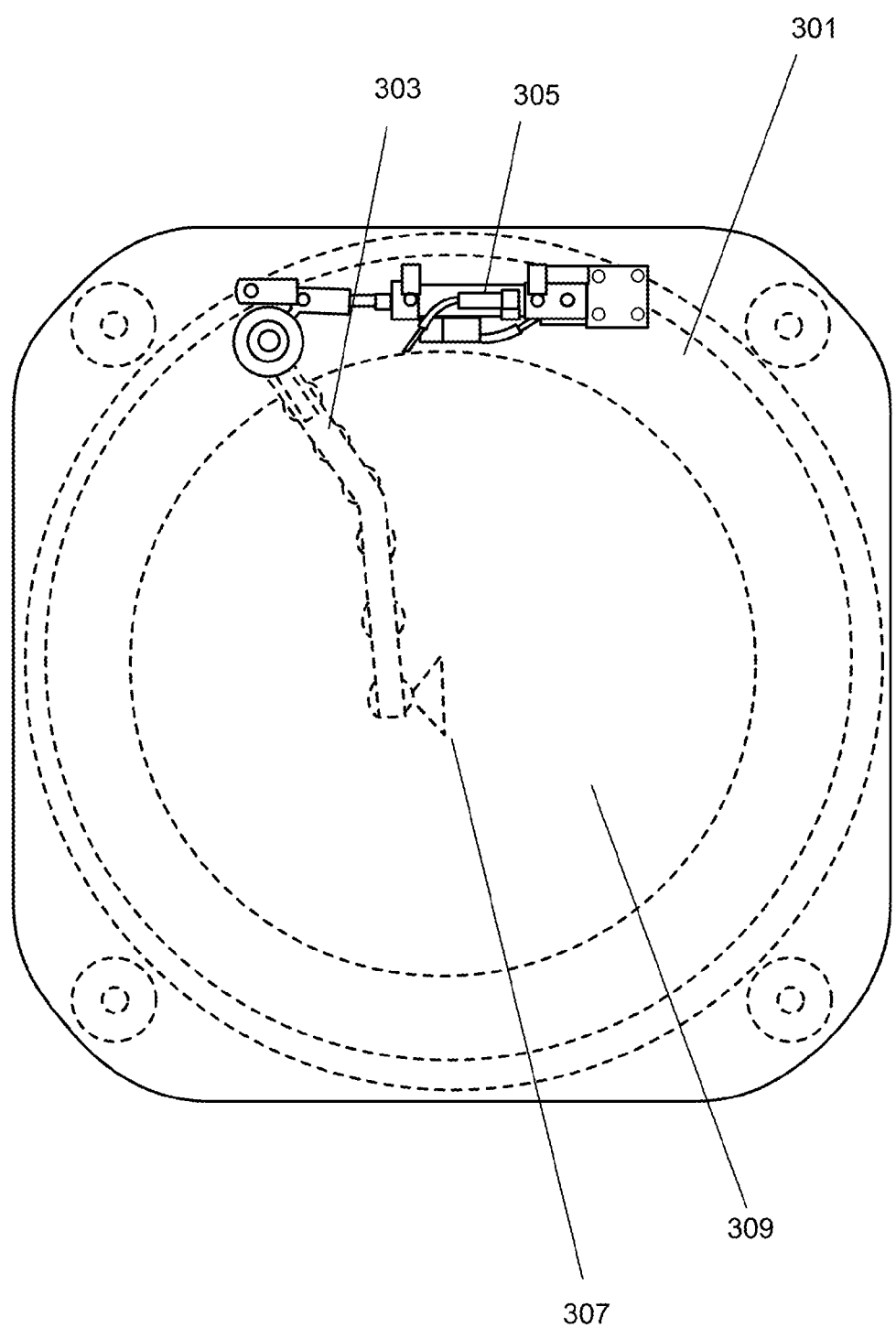
FIG. 3 presents a schematic top view of a process chamber illustrating a nozzle mounted to an arm, where the nozzle delivers the pre-wetting liquid at a grazing angle of between about 5-45 degrees to the plane of the substrate, according to embodiments presented herein.

Referring to FIG. 3, a schematic top view of a portion of an apparatus is shown. The lid 301 (shown to be transparent for clarity) resides above the wafer substrate 309. The rotatable arm 303 is attached to the lid 301 with a rotation mechanism 305. Six nozzles (not visible in top view) are mounted to the rotatable arm 303, wherein one of the nozzles that is closest to the center of the wafer substrate is a nozzle which delivers the pre-wetting liquid 307 towards the center of the wafer at a small grazing angle. FIG. 4 shows as side view of the same portion of the apparatus, where the nozzles delivering the pre-wetting liquid are visible.

FIG. 5 presents a schematic top view of a process chamber illustrating six nozzles mounted to an arm, where two of the nozzles deliver the pre-wetting liquid at a grazing angle of between about 5-45 degrees to the plane of the substrate, and are facing in one direction.

FIG. 6 presents a schematic top view of a process chamber illustrating six nozzles mounted to an arm, where two of the nozzles deliver the pre-wetting liquid at a grazing angle of between about 5-45 degrees to the plane of the substrate, and are facing in opposite directions. A side view of the same apparatus is presented in FIG. 7.

Figure 8:
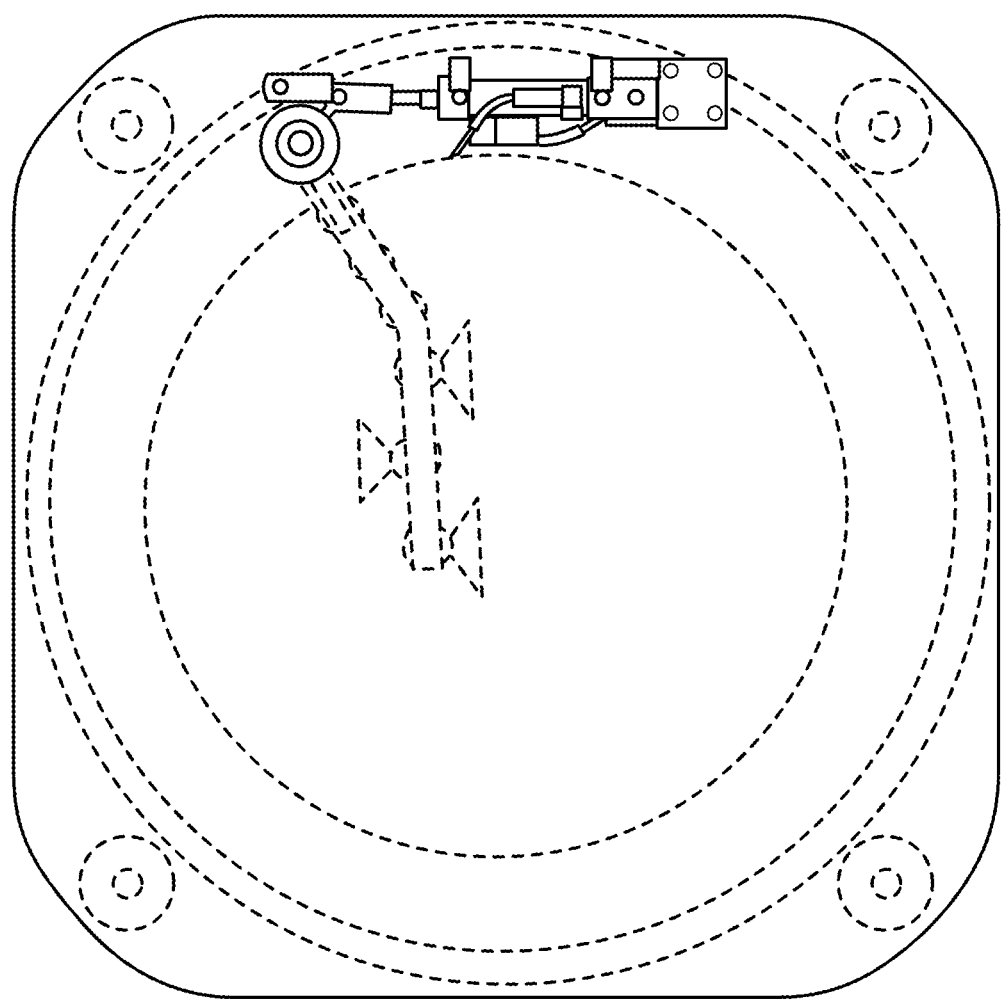
FIG. 8 presents a schematic top view of a process chamber illustrating a plurality of nozzles mounted to an arm, where three of the nozzles deliver the pre-wetting liquid at a grazing angle of between about 5-45 degrees to the plane of the substrate, and where two of the nozzles are facing in the same directions, and one of the nozzles is facing in an opposite direction, according to embodiments presented herein.
Figure 9:
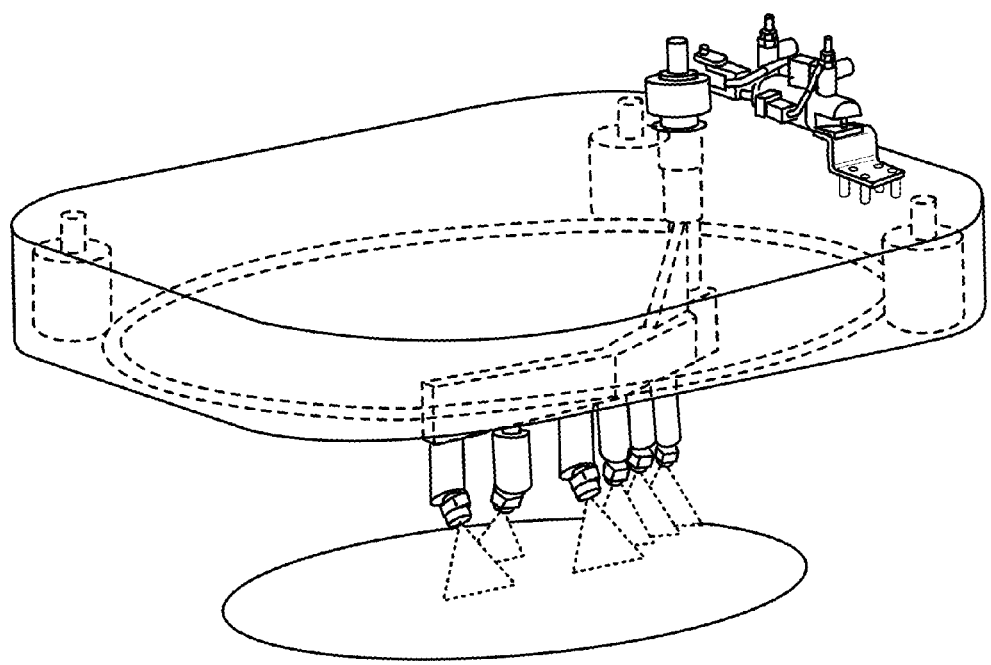
FIG. 9 presents a schematic side view of a process chamber illustrated in FIG. 8.

FIG. 8 presents a schematic top view of a process chamber illustrating six nozzles mounted to an arm, where three of the nozzles deliver the pre-wetting liquid at a grazing angle of between about 5-45 degrees to the plane of the substrate, and where two of these nozzles are facing in the same direction, and one of these three nozzles is facing in an opposite direction. A side view of the same apparatus is presented in FIG. 9.

Moveable Arm with Nozzles

In a separate embodiment which can be used in combination with other embodiments provided herein, an apparatus is provided which includes at least one nozzle connected to a moveable arm, wherein the arm is configured to place the nozzle in an inactive position (not directly above the wafer) and in an active position (directly above the wafer). For example the arm may remain in inactive position prior to pre-wetting process, then rotate into active position and remain in the active position during pre-wetting, and then, after the process is concluded, to rotate back to an inactive position. The arm in some embodiments is also configured to move in the plane parallel to the wafer substrate during the pre-wetting process, such that the nozzles can be positioned over any desired location on the wafer substrate.

Figure 10:
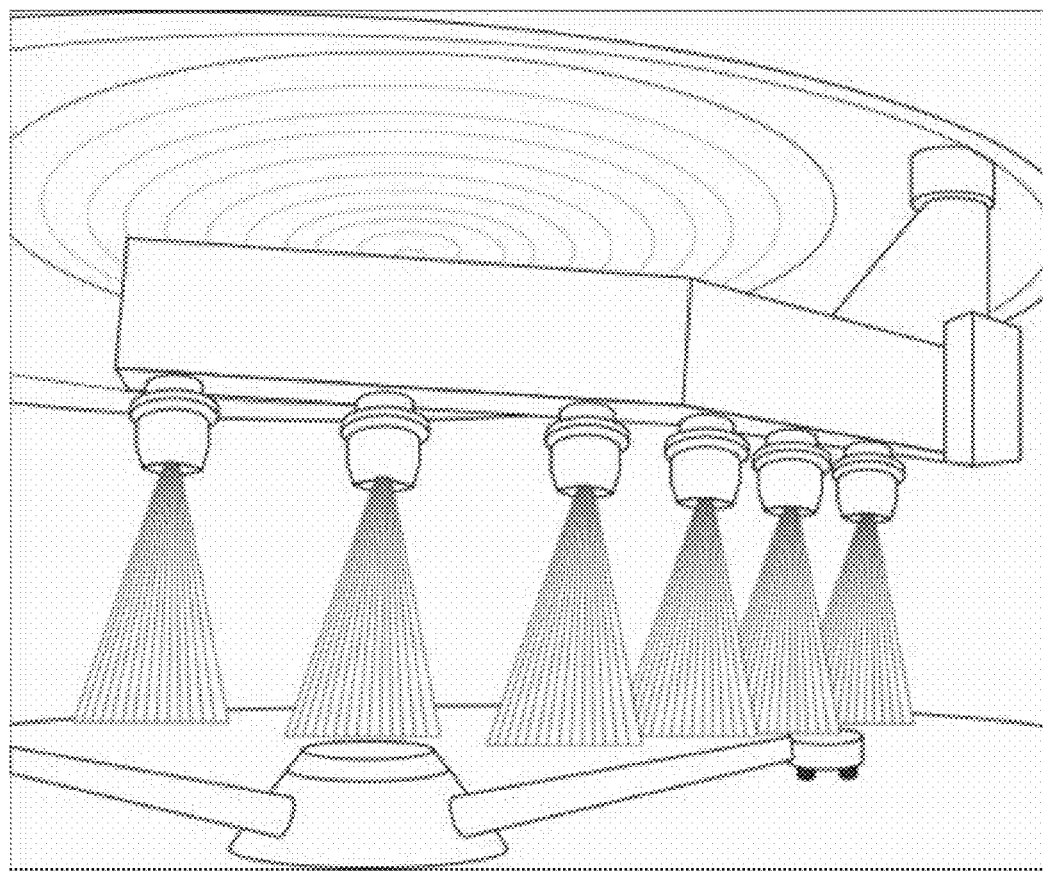
FIG. 10 illustrates a schematic side view of a pre-wetting chamber, showing a plurality of fan nozzles mounted to a moveable arm.
Figure 11:
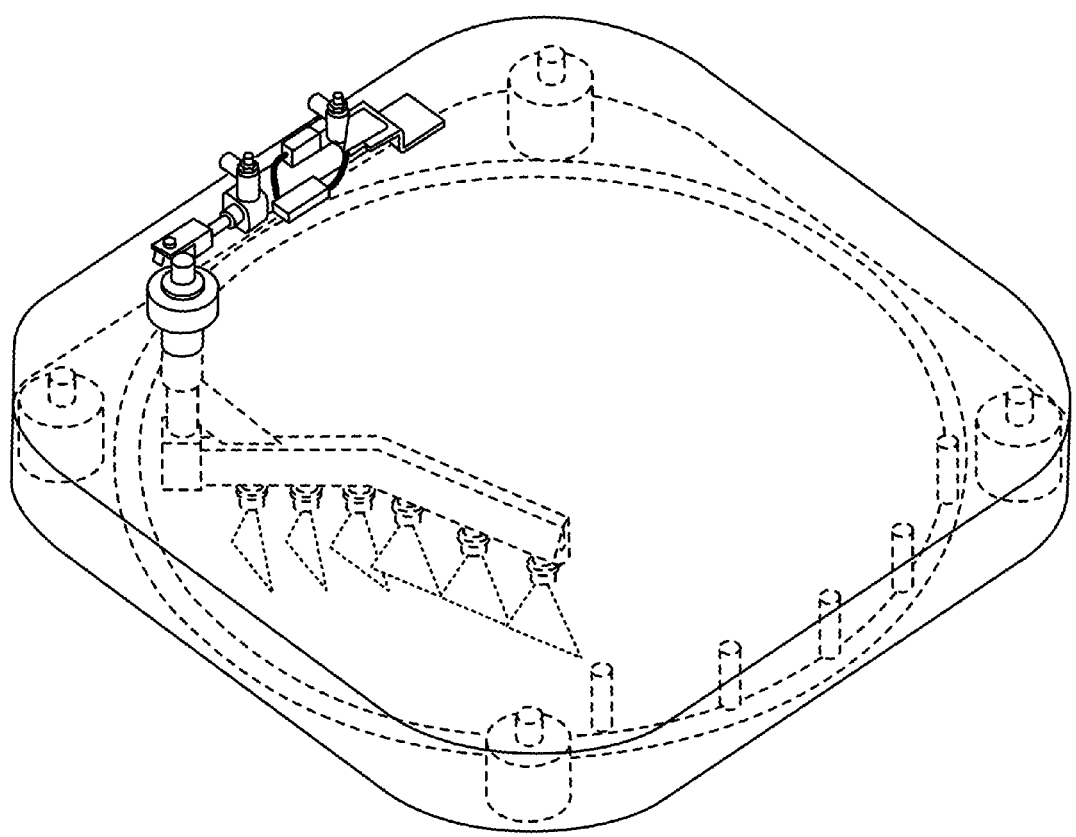
FIG. 11 illustrates a schematic top view of a pre-wetting chamber showing a plurality of fan nozzles mounted to a moveable arm.
Figure 12:
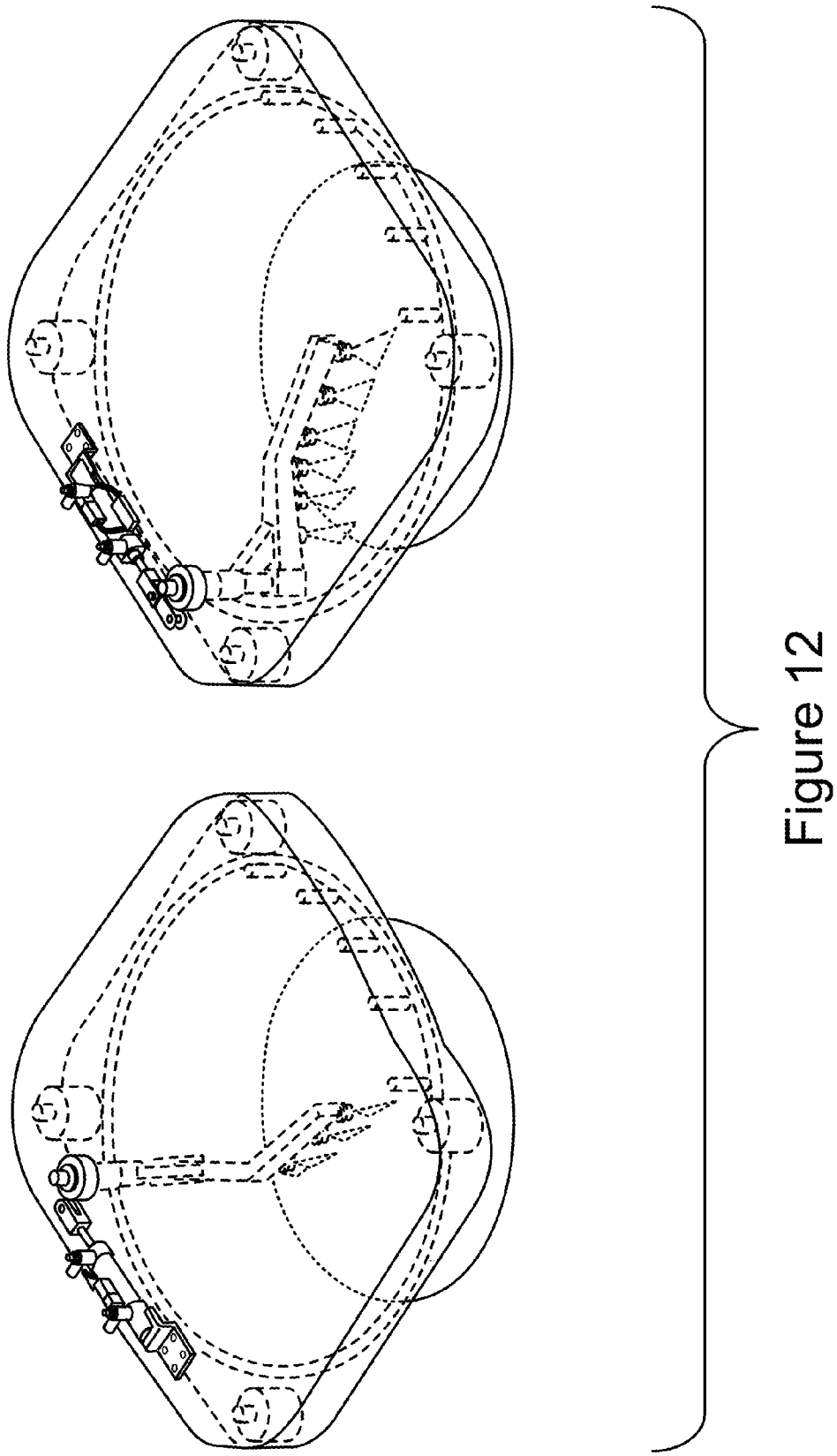
FIG. 12 illustrates two pre-wetting chambers in a module configured for simultaneously processing two wafers, where each of the chambers includes a moveable arm.

The moveable arm with nozzles is illustrated in FIGS. 10-12, which illustrates an arm having six nozzles being connected to a rotation mechanism attached to a lid of a pre-wetting process chamber. In some embodiments, such as in an apparatus shown in FIG. 12 the apparatus has a duet architecture, providing a pair of substrate holders for the pre-wetting module. FIG. 12 illustrates two separate wafer chucks and two arms having a plurality of nozzles that are dedicated for one pre-wetting module. The arms in both cases are positioned in the active "spray" configuration.

In yet another embodiment the moveable arm is configured to be moveable in the plane perpendicular to the wafer substrate, such that the nozzles can be lowered or lifted to adjust the distance between the wafer substrate and the nozzles (typically before pre-wetting).

A Process Chamber Configured for Pre-Wetting Under Subatmospheric Pressure

In some embodiments that can be implemented in combination with any of the embodiments provided herein, the pre-wetting apparatus includes a degasser, configured to degas the pre-wetting liquid prior to its introduction to the pre-wetting process chamber. The degasser, in some embodiments, is a membrane contact degasser. In some embodiments, the pre-wetting apparatus is further configured to reduce pressure in the process chamber to subatmospheric pressure, such that the degassed pre-wetting liquid is delivered to the process chamber that is at subatmospheric pressure during the entire pre-wetting process or in the beginning of pre-wetting. The use of degassed pre-wetting liquid in combination with the use of subatmospheric pressure in the chamber can prevent formation of bubbles within the recessed features, and provide a continuous wetting layer on the surface of a substrate.

Figure 13:
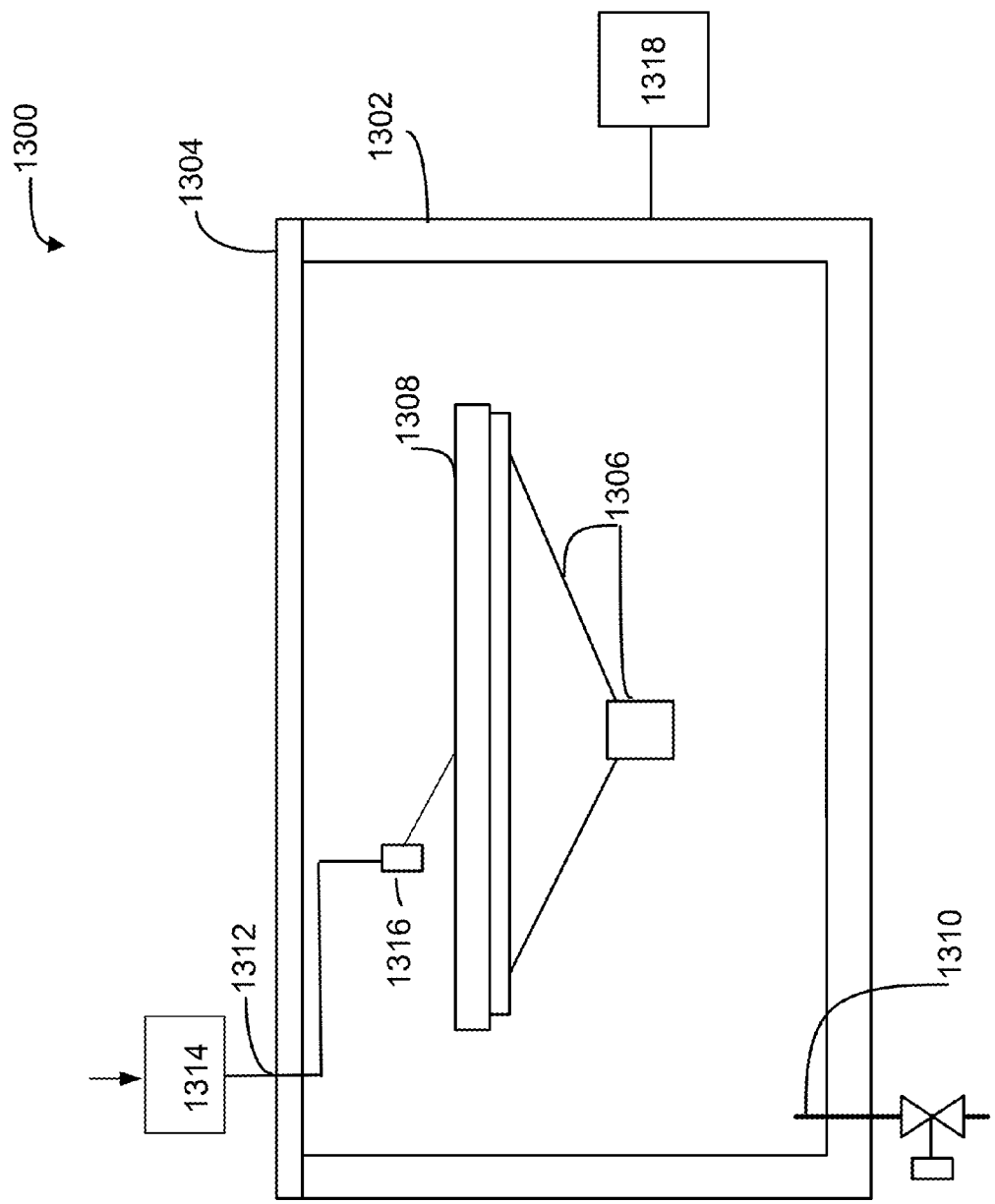
FIG. 13 is a schematic side view of a process chamber configured for pre-wetting the substrate under vacuum using a degassed pre-wetting liquid, according to embodiments provided herein.

A schematic presentation of a suitable process chamber is shown in FIG. 13. A pre-wetting chamber 1300 includes a chamber body 1302 and a chamber cover 1304 that form a vacuum seal when in contact with one another. The chamber body 1302 supports a wafer substrate holder 1306 configured to hold a wafer substrate 1308 and configured to rotate the wafer substrate 1308. The chamber body 1302 further includes a vacuum port 1310. The vacuum port is coupled to a vacuum pump and configured to allow the formation of a subatmospheric pressure in the pre-wetting chamber 1300.

The chamber cover 1304 includes a fluid inlet 1312 coupled to a degasser 1314 and coupled to a nozzle 1316 located downstream from the degasser, where the nozzle is configured to deliver the pre-wetting liquid at a small grazing angle to the wafer substrate. The moveable arm to which the nozzle is mounted is not shown to preserve clarity.

In certain embodiments, the nozzle is configured to deliver the degassed pre-wetting fluid onto the wafer substrate at a velocity of at least about 7 meters per second (m/s) to dislodge photoresist particles from the surface of the wafer substrate. Further, in certain embodiments, the nozzle is configured to deliver the degassed pre-wetting fluid onto the wafer substrate at a flow rate at least about 0.4 L/minute such that the dislodged photoresist particles are washed off of and removed from the wafer substrate.

A process controller 1318 is electrically connected with the process chamber and may include program instructions or logic for performing any of the methods provided herein. For example, the process controller 1318 may control the rotation rate of the substrate and may include program instructions for rotating the wafer bidirectionally and or with multiple accelerations and decelerations during pre-wetting of one substrate.

Modulation of Rotation Rate of the Wafer Substrate

In some embodiments the removal of solid contaminants by a pre-wetting liquid is assisted by modulating the rotation rate of the wafer substrate during delivery of the pre-wetting liquid onto the substrate. These embodiments can be used with a variety of nozzle types, and with any type of apparatus described herein, but are particularly effective in combination with the delivery of the pre-wetting liquid at a small grazing angle, due to combination of forces that result in effective dislodging of contaminants even at the center of the substrate.

In some embodiments the wafer is rotated while periodically being accelerated or decelerated during delivery of the pre-wetting liquid. The accelerations and decelerations are preferably rapid, e.g., at least about 100 rpm per second, or at least about 200 rpm per second. Such rapid accelerations and decelerations may help in formation of eddies within the recessed features and concurrent displacement and removal of particles by these eddies. In some embodiments the wafer substrate changes the direction of rotation to assist the removal of particles from the recessed features during pre-wetting. For example, in some embodiments the wafer is rotated clockwise, followed by deceleration. Next the wafer is accelerated in a counterclockwise direction, followed by rotation in counterclockwise direction. The pre-wetting liquid is delivered continuously or in pulses onto the rotating wafer substrate, preferably at flow rates and velocities that are sufficient to dislodge and remove the particles. For example, the fluid may be delivered at a velocity of at least about 7 meters/second, and at a total flow rate of at least about 0.4 L/minute, e.g., of at least about 1 L/minute. In some embodiments the nozzle or nozzles delivering the fluid to the wafer are positioned within about 50 mm of the wafer surface (e.g., at about 5-80 mm above the wafer surface).

Figure 14:
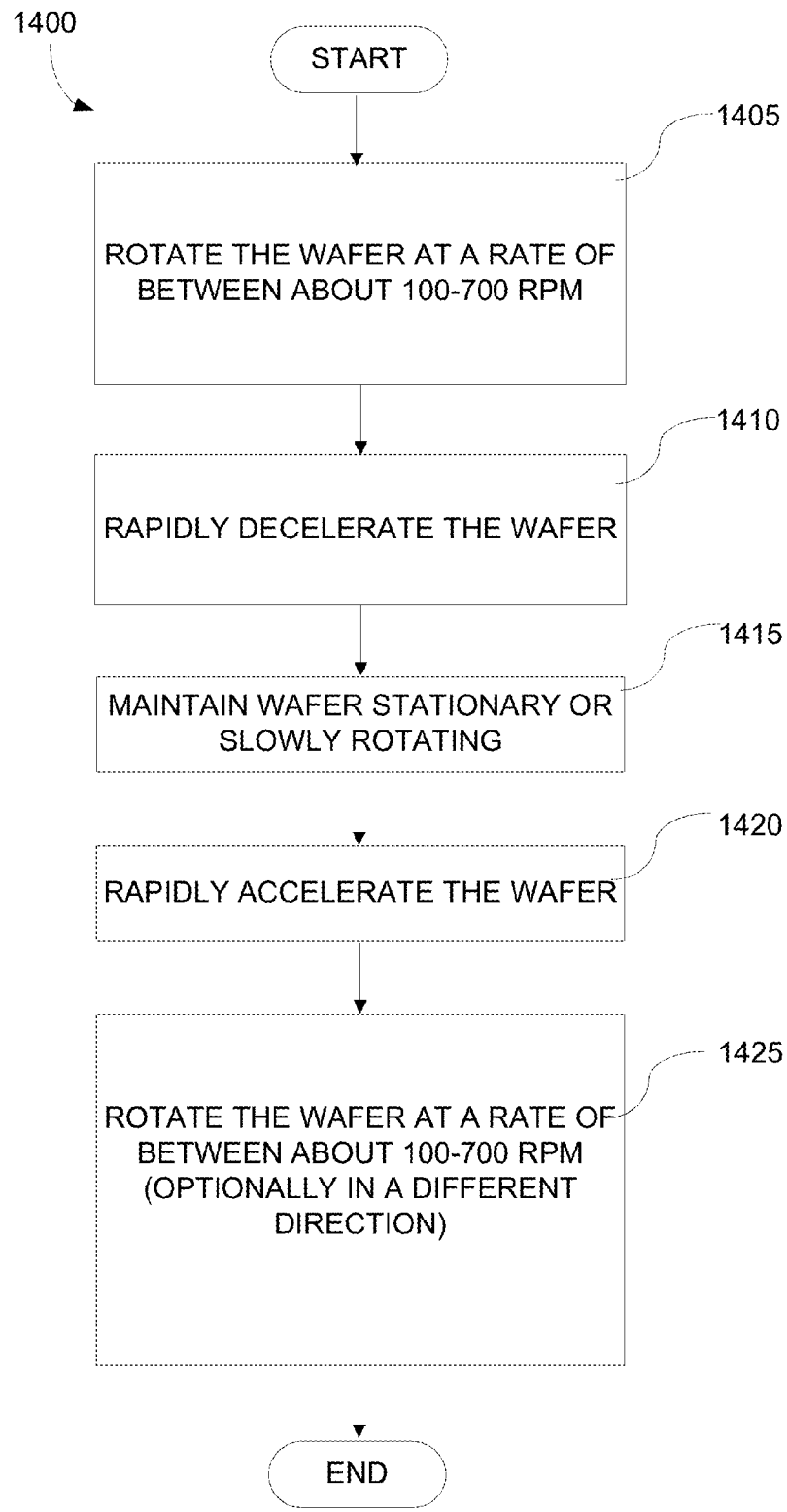
FIG. 14 is an exemplary process flow diagram for a pre-wetting method provided herein.

Exemplary process flow diagram 1400 for one embodiment of the pre-wetting process that uses modulation of wafer rotation rate is illustrated in FIG. 14. The entire process is performed while the pre-wetting fluid is delivered (continuously or discontinuously) onto the wafer substrate. In operation 1405 the wafer is rotated at a relatively high rate of between about 100-700 rpm. In some embodiments, the wafer is rotated in one direction at this rate for up to 10 seconds (e.g., for about 5 seconds). Next, in operation 1410, the wafer is rapidly decelerated to a stationary position or to a small target rotating speed (typically not exceeding 20 rpm). The deceleration preferably is very rapid and occurs, in some embodiments, over not more than 1 second. Next, in operation 1415 the wafer is allowed to remain in the stationary position for a short period of time (e.g., for between about 0.1-3 seconds, such as for between about 0.1-1 seconds) or is rotated at a low speed for a short period of time (e.g., for between about 0.1-3 seconds, such as for between about 0.1-1 seconds). Next, in operation 1420 the wafer is rapidly accelerated (in the same or opposite direction as compared to direction of rotation in 1405). Preferably acceleration to a speed of between about 100-700 rpm occurs over a period of not more than 1 second. Next, as noted in operation 1425, the sequence can be repeated as many times as necessary. In a typical process between about 10-60 accelerations are performed.

Periodically changing the direction of rotation from clockwise to counterclockwise and back creates an environment on the wafer which allows for more efficient removal of particles from the recessed features on the substrate. In other embodiments, the direction of rotation is not changed.

In one specific example of this sequence the wafer is rotated at about 400 rpm for about 5 seconds, is then decelerated to a standstill over a period not exceeding 1 second, is allowed to remain stationary for not more than about 3 seconds, and is then rapidly accelerated in the same direction over a period of not more than about 1 second to a speed of about 400 rpm. A degassed deionized water is delivered onto the wafer continuously in this example at a flow rate of at least about 0.4 L/min.

The degassed pre-wetting fluid is delivered onto the wafer substrate using one or more nozzles, such as fan nozzles described above. In some embodiments the one or more nozzles are perpendicularly oriented towards the plane of the wafer substrate, and are configured to deliver the pre-wetting fluid substantially perpendicular to the wafer substrate. In some embodiments the apparatus includes one or more nozzles configured to deliver the pre-wetting fluid at a grazing angle of between about 5-45 degrees, such as between about 5-30 degrees. Such nozzle or nozzles in some embodiments are configured to deliver the fluid in the general direction from the edge of the wafer towards the center of the wafer. In some embodiments the fluid that is delivered in this regime first impacts the wafer substrate near the center of the wafer (e.g., within about 1-2 inches of the center), but not directly at the center of the wafer. The fluid then overflows through the center, thereby creating a tangential flow component in the center of the substrate. This mode of impact, when coupled with variations in rotational speed of the wafer substrate, provides improved results for particle removal at the center of the wafer substrate.

While in some embodiments the pre-wetting chamber remains under subatmospheric pressure during the entire time while the pre-wetting fluid is being delivered, and while the rotation rate of the wafer is being modulated, in some embodiments, the pre-wetting chamber remains at subatmospheric pressure only during a portion of the fluid delivery time, e.g., in the beginning of the process.

Figure 15:
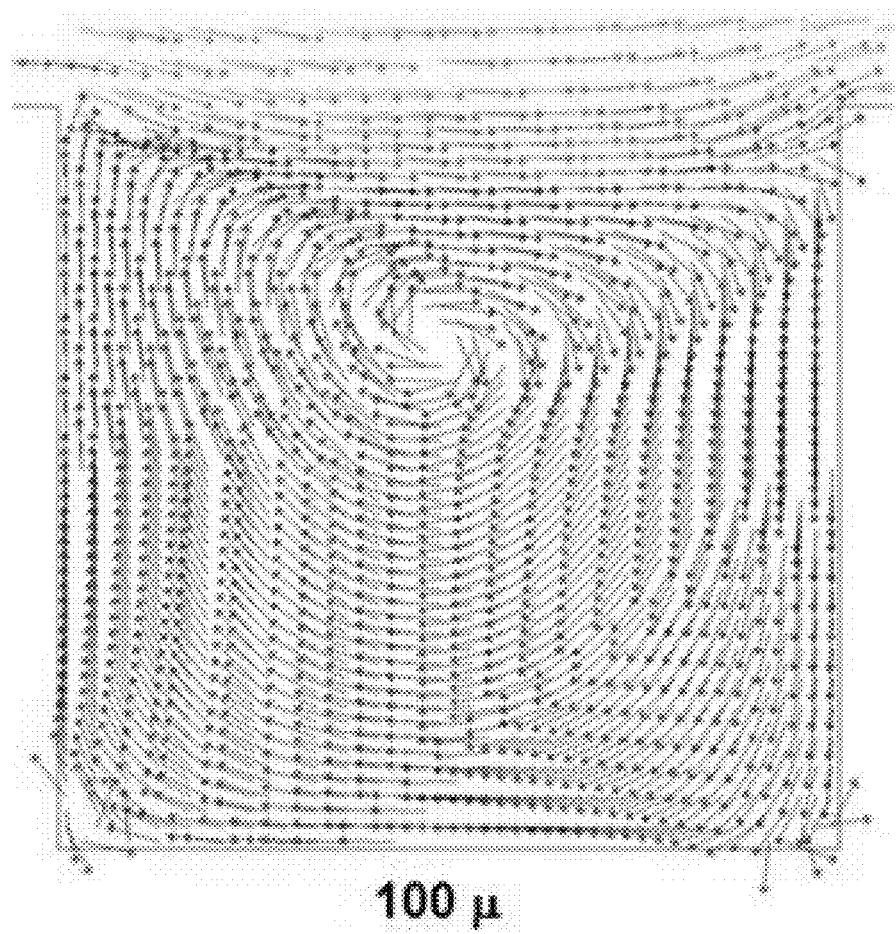
FIG. 15 illustrates flow patterns in a recessed feature in accordance with embodiments provided herein.
Figure 16:
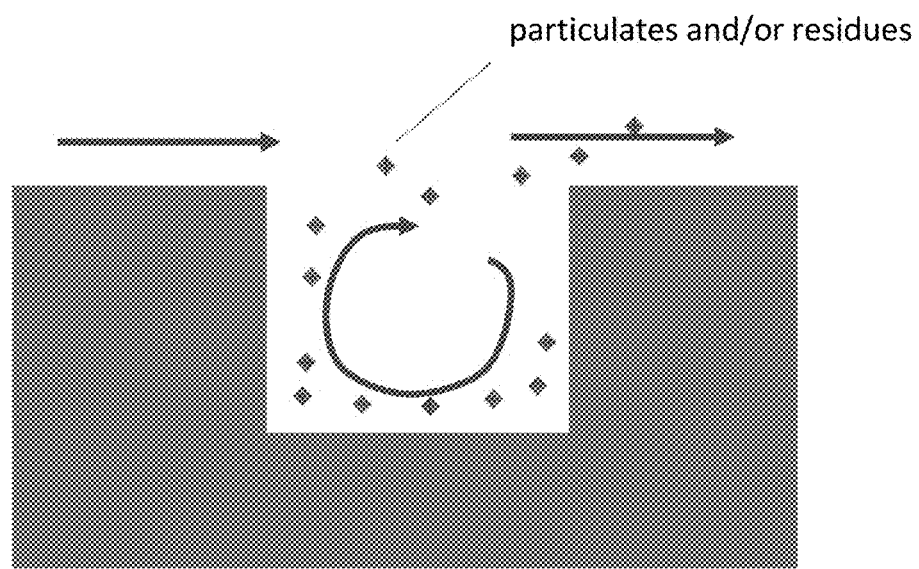
FIG. 16 illustrates removal of particles from a recessed feature, where the substrate is subjected to a tangential liquid flow.
Figure 17:
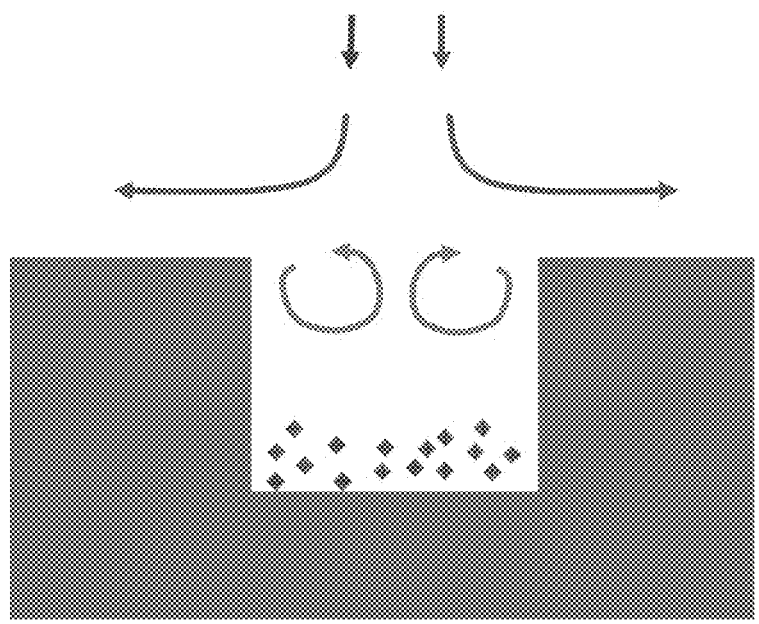
FIG. 17 illustrates residual particles in a recessed feature in a substrate subjected to a liquid flow that is normal to the surface of the substrate.

The advantages of using tangential flow of pre-wetting liquid are illustrated with reference to FIGS. 15, 16, and 17. FIG. 15 illustrates results of computational modeling, showing flow patterns in a 100 µm×100 µm cylindrical via, for a case, where there exists tangential flow of liquid parallel to substrate surface. Computational modeling clearly shows formation of eddies in this instance. The pre-wetting fluid delivered at a small grazing angle onto the substrate will have a substantial tangential flow component (parallel to the substrate surface), and will create eddies which will facilitate removal of particulates and/or residue from the recessed features. FIG. 16 illustrates a simplified cross-sectional depiction of a recessed feature having particulates and/or residue inside, which is subjected to a tangential flow of pre-wetting fluid. Good dynamic fluid eddy formation in recessed feature helps to remove particulates and/or residue otherwise trapped in recessed feature. FIG. 17 illustrates a simplified cross-sectional depiction of a recessed feature having particulates inside the feature, wherein the substrate surface is subjected to pre-wetting fluid directed normal to the substrate surface. Depicted flow introduced with no tangential component leads to stagnation within recessed feature, and/or to formation of poor multiple small eddies that do not penetrate the recessed feature efficiently. Stagnation and/or small weak eddies within the recessed feature lead to poor removal of particles and residues in the recessed feature.

The embodiments described above can be integrated into a variety of types of apparatus. In some embodiments the apparatus includes a process chamber having a substrate holder, a degasser for delivering degassed pre-wetting liquid, a vacuum port for creating subatmospheric pressure in the process chamber and a fluid inlet typically terminating in one or more nozzles configured to deliver the pre-wetting fluid onto the substrate. Typically the process chamber is maintained at a subatmospheric pressure during at least the initial contact of the pre-wetting liquid with the substrate. Subsequently the pressure in the chamber may be brought to atmospheric or higher than atmospheric and the pre-wetting process may continue. In other embodiments the entire pre-wetting process is performed at subatmospheric pressure. The apparatuses and methods which can be integrated with the embodiments described herein, are described, for example in the US Application Pub. No. 2013/0171833, published on Jul. 4, 2013 by Buckalew et al., which is herein incorporated by reference in relevant part. After pre-wetting is completed, in some embodiments, the substrate is transferred to an electroplating chamber and metal is electrodeposited onto the pre-wetted and cleaned substrate.

The apparatus/methods described hereinabove may be used in conjunction with lithographic patterning tools or processes, for example, for the fabrication or manufacture of semiconductor devices, displays, LEDs, photovoltaic panels and the like. Generally, though not necessarily, such tools/processes will be used or conducted together in a common fabrication facility. Lithographic patterning of a film generally comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible, UV, or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

Although the foregoing apparatus designs and methods have been described in some detail for purposes of clarity of understanding, it will be apparent that certain changes and modifications may be practiced within the scope of the appended claims. It should be noted that there are many alternative ways of implementing both the process and compositions described herein. Accordingly, the present embodiments are to be considered as illustrative and not restrictive, and embodiments are not to be limited to the details given herein.

The invention claimed is:

1. A method of pre-wetting a wafer substrate, the method comprising:
    (a) degassing a pre-wetting liquid;
    (b) placing the wafer substrate into a pre-wetting process chamber, and forming subatmospheric pressure in the pre-wetting process chamber;
    (c) moving a moveable arm having one or more nozzles from an inactive position to an active position in the process chamber; and
    (d) delivering the degassed pre-wetting liquid from the one or more nozzles onto the wafer substrate at the subatmospheric pressure, wherein the pre-wetting liquid impacts the wafer substrate at a grazing angle of between about 5-45 degrees to the plane of the substrate.

2. The method of claim 1, further comprising increasing the pressure in the process chamber to atmospheric pressure during the pre-wetting.

3. The method of claim 1, wherein the substrate comprises a through-resist recessed feature.

4. The method of claim 1, further comprising rotating the wafer substrate clockwise and counterclockwise during the delivery of the pre-wetting liquid, wherein the direction of rotation is changed between about 4-100 times during the pre-wetting.

5. The method of claim 1, further comprising accelerating and decelerating the wafer substrate during the delivery of the pre-wetting liquid, wherein between 10-60 accelerations are performed during the pre-wetting of the wafer substrate.

6. The method of claim 1, wherein the wafer substrate is placed onto a substrate holder in the pre-wetting process chamber in a face-up orientation in (b).

7. The method of claim 1, wherein the pre-wetting liquid impacts the wafer substrate at a grazing angle of between about 5-30 degrees to the plane of the substrate.

8. The method of claim 1, wherein the pre-wetting liquid is water.

9. The method of claim 1, wherein when the moveable arm is in the active position, the one or more nozzles are positioned directly above the wafer substrate.

10. The method of claim 1, wherein when the moveable arm is in the active position, the one or more nozzles are positioned within about 80 mm of the wafer substrate.

11. The method of claim 1, wherein delivering the degassed pre-wetting liquid from the one or more nozzles onto the wafer substrate is performed in a general direction from an edge towards a center of the wafer substrate.

12. The method of claim 1, wherein delivering the degassed pre-wetting liquid from the one or more nozzles onto the wafer substrate is performed while rotating the wafer substrate and while directing the pre-wetting liquid such that the horizontal component of the pre-wetting liquid velocity is substantially opposite to the direction of rotation of the wafer substrate.

13. The method of claim 1, further comprising:
    (e) after delivering the pre-wetting liquid onto the wafer substrate, moving the moveable arm from the active position to the inactive position.

14. The method of claim 1, further comprising moving the moveable arm in a plane parallel to the wafer substrate during pre-wetting of the wafer substrate, such that the one or more nozzles are positioned at a desired location over the wafer substrate.

15. The method of claim 1, wherein forming the subatmospheric pressure is forming a pressure of less than about 100 torr.

16. The method of claim 1, wherein forming the subatmospheric pressure is forming a pressure of less than about 50 torr.

17. The method of claim 1, wherein the wafer substrate is contacted with the pre-wetting liquid for about 10-120 seconds.

18. The method of claim 1, wherein the pre-wetting liquid comprises water and a surfactant.

19. The method of claim 1, wherein delivering the pre-wetting liquid onto the wafer substrate comprises delivering the pre-wetting liquid such that it first impacts the wafer substrate near the center but not directly at the center, allowing the pre-wetting liquid to spill over the center of the substrate.

20. The method of claim 1, further comprising:
    applying photoresist to the wafer substrate;
    exposing the photoresist to light;
    patterning the photoresist and
    transferring the pattern to the wafer substrate.

* * * * *